United States Patent
Baumann et al.

(10) Patent No.: US 8,576,604 B2
(45) Date of Patent: Nov. 5, 2013

(54) IDENTIFYING AND CORRECTING A BIT ERROR IN A FRAM STORAGE UNIT OF A SEMICONDUCTOR DEVICE

(75) Inventors: Adolf Baumann, Haag a.d. Amper (DE); Christian Sichert, Attenkirchen (DE)

(73) Assignee: Texas Instruments Incorporated, Dallas, TX (US)

( * ) Notice: Subject to any disclaimer, the term of this patent is extended or adjusted under 35 U.S.C. 154(b) by 77 days.

(21) Appl. No.: 13/366,686

(22) Filed: Feb. 6, 2012

(65) Prior Publication Data
US 2012/0206957 A1     Aug. 16, 2012

(30) Foreign Application Priority Data
Feb. 10, 2011 (DE) .................... 10 2011 010 946.3

(51) Int. Cl.
*G11C 11/22* (2006.01)
(52) U.S. Cl.
USPC .......................................................... 365/145
(58) Field of Classification Search
USPC ................................................ 365/145, 201
See application file for complete search history.

(56) References Cited

U.S. PATENT DOCUMENTS 6,606,261 B2 *  8/2003  Gudesen et al. ............ 365/145
6,704,218 B2 *  3/2004  Rickes et al. ............... 365/145

FOREIGN PATENT DOCUMENTS

DE     3210644 A1     10/1982

OTHER PUBLICATIONS

Vittoz, E. A.; Degrauwe, M.G. R.; Bitz, S., High Performance Crystal Oscillator Circuits: Theory and Application, IEEE Journal of Solid-State Circuits, vol. 23, No. 3, Jun. 1988, pp. 774-783.

* cited by examiner

*Primary Examiner* — Anthan Tran
(74) *Attorney, Agent, or Firm* — John R. Pessetto; W. James Brady; Frederick J. Telecky, Jr.

(57) ABSTRACT

An embodiment of semiconductor device including a control unit and an FRAM storage unit is disclosed. The FRAM storage unit contains FRAM cells. The control unit includes a predetermined test data pattern. The control unit is configured to read the FRAM cells that contain a test data pattern in a margin-mode, compare the read out bit information with the test data pattern to determine whether a bit error is present in the dedicated FRAM cells. When a bit error is present, the control unit is configured to read-out the complete FRAM storage unit in a recovery-mode and refresh all FRAM cells of the FRAM storage unit by writing back the read out bit information to the respective FRAM cells. In the margin-mode, the read operation is performed using a lower read-sensitivity compared to the read operation reading out the complete FRAM storage unit that is performed in the recovery-mode.

8 Claims, 3 Drawing Sheets

IDENTIFYING AND CORRECTING A BIT ERROR IN A FRAM STORAGE UNIT OF A SEMICONDUCTOR DEVICE

CROSS-REFERENCE TO RELATED APPLICATION

This patent application claims priority from German Patent Application No. 10 2011 010 946.3, filed Feb. 10, 2011, which is incorporated herein by reference in its entirety.

BACKGROUND

A ferro-electric random access memory (also referred as FeRAM or FRAM) is a random access memory similar in construction to a DRAM. Since an FRAM memory uses a ferro-electric film as for a capacitor to store data instead of a dielectric layer, it is non-volatile. An FRAM storage unit has the characteristics of both, ROM (Read-only Memory) and RAM (Random Access Memory) and allows high-speed writing while having a high endurance, low power consumption and tamper resistance The capability of non-volatile data storage in FRAMs is based on the spontaneous polarization effect of ferro-electric materials like lead zirkonate titanate (PZT) due to an applied electric field. The spontaneous polarization is typically due to a displacement of a single atom in the crystal structure and does not disappear in the absence of the applied electric field. The polarization direction depends on the polarity of the electric field across the ferro-electric layer/material. A remanent polarization remains after removal of the electric field, and a direction of the remanent polarization in the ferro-electric capacitor provides a basis for the non-volatile data storage states in the FRAM memories.

The polarization change of a ferro-electric capacitor versus an applied voltage is exemplarily shown in FIG. 1. Due to the remanent polarization, this curve shows a hysteresis loop like ferro-magnetic materials. The signal margin $\Delta P = P'1' - P'0'$ of the ferro-electric capacitor is the difference in the remanent polarization between the "Data 1" and "Data 0" state. Although the polarization of each individual unit cell is tiny, the net polarization of several domains (each capacitor inside an FRAM-cell comprises several unit cells) can be large enough for detection using standard sense amplification designs. The main effect of polarization is a non-zero charge-per-unit area of the ferro-electric capacitor that is existing at zero voltage and does not disappear over time. The polarization charge corresponds to a voltage across the capacitor in a same way as the magnetic flux of a ferro-magnetic core corresponds to the current through said core.

However, data retention of a non-volatile FRAM, i.e. the remanent polarization of the ferro-electric material, is lowered mainly by three effects. First, there is a polarization relaxation which is a polarization reduction that happens right after a data write cycle. This effect takes place in a millisecond time range after the writing process and after about 15 ms a steady state may be assumed. A second effect is imprint, which is the stabilization of polarization in a preferred state. The so-called "Same-State" retention is strengthened while the "Opposite-State" retention is considerably weakened. Finally, there is thermal depolarization which is a reduction of the spontaneous polarization with increasing temperature of the ferro-electric material. Thermal depolarization is due to the effect that the spontaneous polarization decreases if the temperature of the ferro-electric material approaches the phase transition temperature, i.e. the Curie Temperature TC of the ferro-electric material. Even though TC for PZT is about 430° C., due to different order phase transitions this effect is already observed at temperatures used with packing of semiconductor devices and assembly of electronic end-equipment boards.

SUMMARY

It is an object of the present invention to provide a semiconductor device comprising an FRAM storage unit and a method for identifying and correcting a bit error in an FRAM storage unit that are improved with respect to detection and restoration of thermally degraded bits of the FRAM storage unit.

In one aspect of the invention, a semiconductor device comprising a control unit and an FRAM storage unit having FRAM cells comprising a predetermined test data pattern is provided. The control unit is configured to: read the FRAM cells in a margin mode wherein the read FRAM cells are dedicated to the test data of the test data pattern. Further, the control unit is configured to compare the read-out bit information with the predetermined test data pattern to determine whether a bit error is present in the dedicated FRAM cells. If so, the complete FRAM storage unit is read out in a recovery mode and all FRAM cells of the FRAM storage unit are refreshed by writing back the read-out bit information to the respective FRAM cells. The control unit is configured to perform the read operation in the margin mode using a lower read sensitivity compared to the read operation reading out the complete FRAM storage unit that is performed in the recovery mode.

Thermal depolarization affects all cells of an FRAM storage unit in a same way. Accordingly, the FRAM cells that are dedicated to the predetermined test data pattern are suitable for testing the thermal degradation of the complete FRAM storage unit. If a read-out of this reference memory cells fails, it is assumed that all over the memory, i.e. all FRAM cells of the FRAM storage unit, have degraded too. However, since a lower read-sensitivity is used, the degradation will not be complete, and read-out of the FRAM cells will still work if an increased sensitivity is used in the recovery mode. Data information that is recovered in the recovery mode, wherein as much as possible bit information shall be safeguarded, is stored and written back to the FRAM storage unit in order to refresh the memory.

The test data pattern is read during a startup sequence of the semiconductor device. However the check may be carried out frequently, i.e. after expiration of a predetermined time span. Advantageously no user interaction is necessary.

According to an embodiment of the invention, in the margin mode, a sense voltage is applied to the FRAM cells comprising the test data pattern so as to lower a bit cell signal of the respective FRAM cells. According to another advantageous embodiment, the FRAM cells of the FRAM storage unit comprise a sense amplifier for providing a bit line signal, and the sense voltage is applied to the sense amplifier so as to lower a level of the bit cell output signal provided to the bit line. Applying a sense voltage means reducing the actual bit cell signal by a given amount. If the semiconductor device or even the FRAM storage unit was exposed to a temperature causing an appreciable thermal depolarization, the bit cell signal of the reference cells, i.e. the FRAM cells comprising the predetermined test data pattern, is no longer strong enough to exceed the sense voltage and therefore the read-out fails. The sense voltage is generated on-chip and applied to the embedded FRAM memory during this operation.

According to another aspect of the invention, a predetermined set of parameters is used for a standard read-out operation of the FRAM cells and for the read-out operation of the complete FRAM storage in the recovery mode a further set of parameters is applied so as to provide a read process having a higher bit cell signal in comparison to the bit cell signal in the read operation using the set of parameters for the standard read-out. In an aspect of the invention, the further set of parameters causes a timing of the bit cell signals to slow down and/or a plate line to provide a higher voltage to the FRAM cells—in comparison to the standard read-out operation.

In modern high-performance and high-density memories, the normal operation speed and voltage levels are a trade-off between performance, occupied area of the memory cells and reliability. Slowing down the timing of the respective parameters typically improves the signal to noise ratio but may however not meet the system speed requirements. Higher voltage levels will improve the bit cell signal but may exceed the operating voltage range and are therefore not used in normal operation. However, for a recovery read-out, these parameters are acceptable on an exceptional basis. Advantageously, reading out the FRAM cell in the recovery mode allows recovering as much information as possible.

According to another embodiment of the invention, the control unit is further configured to perform the write-back operation using the further set of parameters. Advantageously the control unit is further configured to perform a bit error correction before writing back the read-out bit information. In other words, the recovery read may advantageously be combined with an active error detection and error correction. In case no uncorrected errors remain, the recovery read-out was successful and the data integrity of the FRAM storage unit is fully restored. Once the recovery read has finished, the data pattern and the reference pattern that are stored in the respective FRAM cells are advantageously fully restored and refreshed. After restoring the normal timing, in case the further set of parameters is applied, the semiconductor device can resume its normal operation, e.g. the boot sequence.

In another aspect of the invention, a method for identifying and correcting a bit error in an FRAM storage unit of a semiconductor device is provided. The FRAM storage unit has a plurality of FRAM cells comprising a predetermined test data pattern. The method comprises the steps of: reading the FRAM cells that are dedicated to the test data patter in a margin mode. The method further comprises: comparing the read-out bit information with the predetermined test data pattern to determine whether a bit error is present in the dedicated FRAM cells and if so: The method comprises the steps of reading out the complete FRAM storage unit in a recovery mode. All FRAM cells of the FRAM storage unit are refreshed by writing back the read-out bit information. The read operation that is performed in the margin mode that uses a lower read-out sensitivity compared to the read-out operation of the complete FRAM storage unit that is performed in the recovery mode.

Same or similar advantages already mentioned for the semiconductor device according to the invention apply to the method according to the invention.

In another advantageous aspect of the invention, the test data pattern comprises either only the most critical data state (which is normally the Data "1"—State or it comprises Data "0" and Data "1" states. At the time of programming the states constituting the test data pattern, this bit cell information has a maximum polarization which means the FRAM cell creates the maximum bit cell signal during read-out. Thermal degradation of the bit information in the FRAM cells is determined by reading out this test data pattern. Advantageously, and if only weak data states are used, there is a higher safety margin for the rest of the stored data in comparison to a test data pattern using a mixture of strong and weak data states, i.e. high and low, Data "1" and Data "0"—states, respectively.

DETAILED DESCRIPTION OF AN EXAMPLE EMBODIMENT

Figure 1:
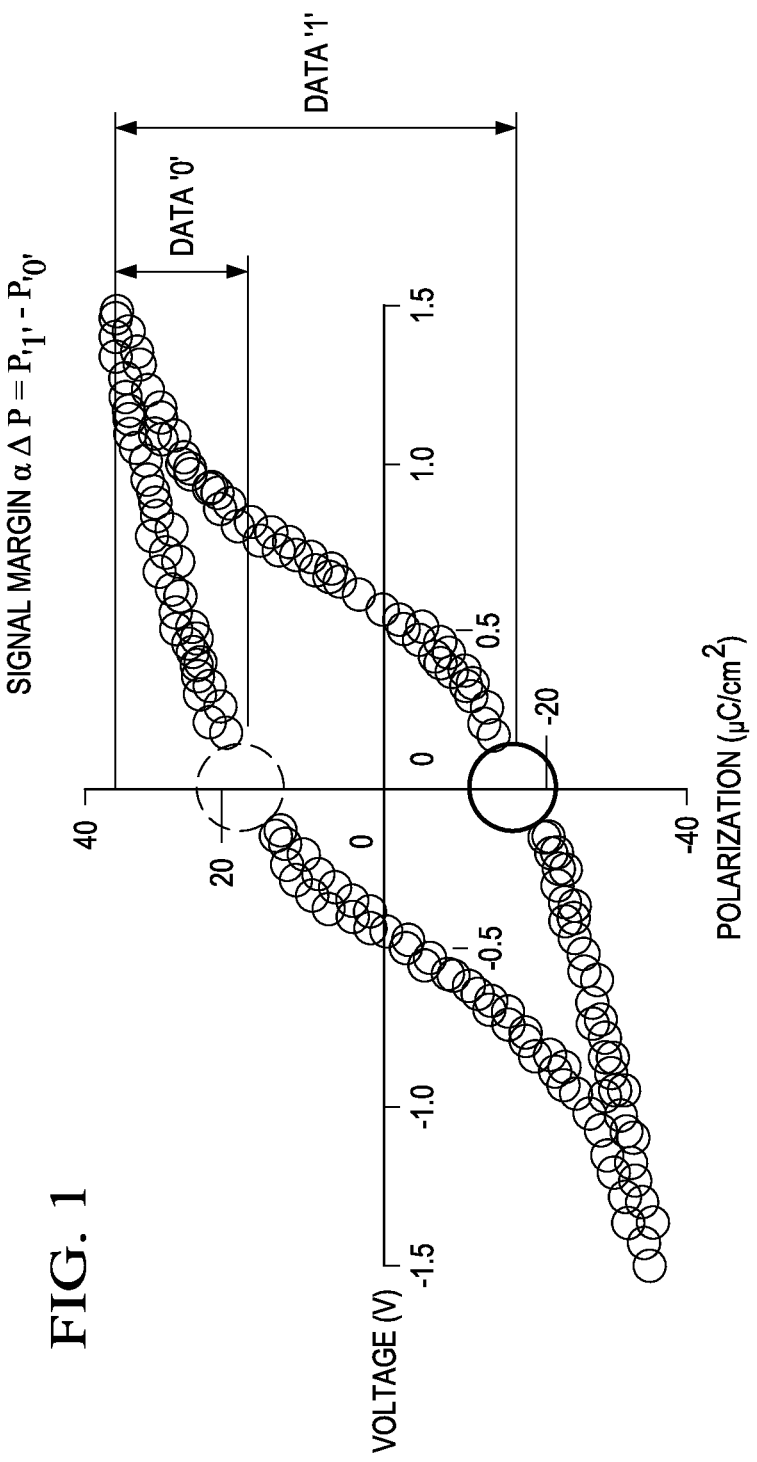
FIG. 1 is an exemplary hysteresis loop showing the polarization of an FRAM capacitor over an applied voltage.

FIG. 1 is a diagram showing exemplarily showing the polarization over a voltage that is applied to an exemplary FRAM capacitor. During a write cycle, a maximum voltage of +1.5 V is applied which results in a maximum polarization of about +35 $\mu C/cm^2$. A remanent polarization of about +20 $\mu C/cm^2$ remains if the voltage is set to zero again. This remanent polarization is identified as the Data "0"-state. For writing the opposite bit state, a respective negative voltage of −1.5 V is applied and accordingly, if the voltage is again set to zero, a remanent polarization of −20 $\mu C/cm^2$ remains. This state is typically identified with the Data "1"-state. The signal margin of an FRAM capacitor or an associated FRAM cell is the difference in polarization $\Delta P$ between the polarization for the Data "1"-state and the Data "0"-state, i.e.

$$\Delta P = P_1 - P_0$$

For read-out of an FRAM cell a sense amplifier is used to amplify the signal that is directly provided by the FRAM cells to a bit line in order to provide a signal having a sufficient strength and a sufficient signal-to-noise ratio to a data bus. Further details will be explained by making reference to FIG. 4.

When applying a reference voltage to the input channels of the sense amplifier a signal strength that is provided by the respective FRAM cells is lowered with increasing reference voltage. In other words, a high the reference voltage implies a high bit cell signal in order to keep the Bit Error Rate still low. On the other hand, if the signal from the FRAM cell is pretty weak a small reference voltage is sufficient to cause in a high bit rate error rate.

Figure 2:
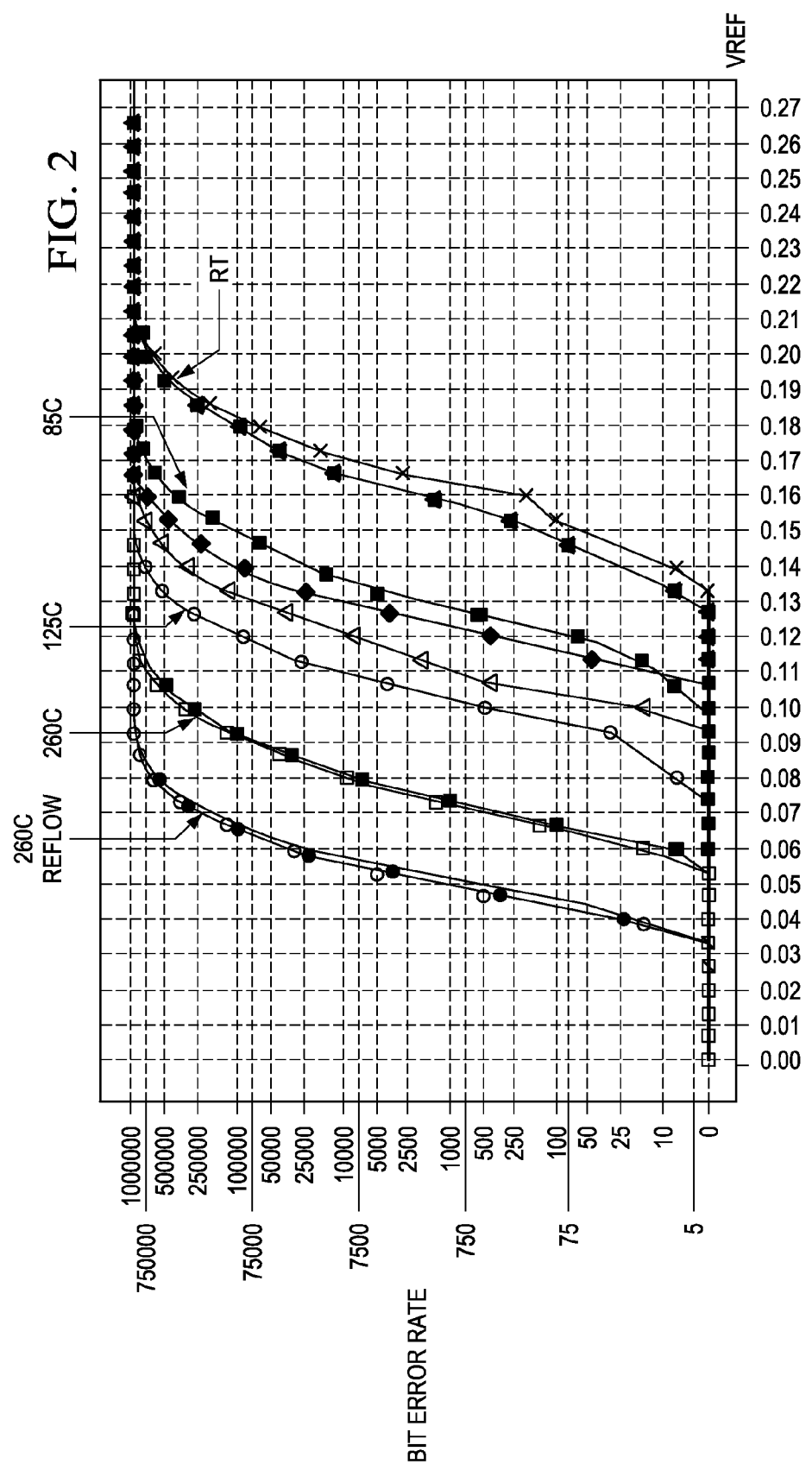
FIG. 2 is graph showing a bit error fail rate for an FRAM unit for various applied reference voltages for different FRAM units that have been exposed to different temperatures.

FIG. 2 is a diagram showing a Bit Error Rate over the aforementioned reference voltage for FRAM unit samples that have been exposed to different temperatures. While a first curve RT shows the behavior of an FRAM unit after that has been kept at room temperature, the further curves 85 C, 125 C, 260 C and 260 C reflow show the behavior of FRAM units after exposure to 85° C., 125° C., 260° C. and 260° C. in a reflow soldering process, respectively. For the FRAM storage unit that has been kept at room temperature, a reference voltage VREF of 0.13-0.15 V is necessary to cause a significant increase of the bit fail rate. In other words, the signal from the FRAM storage units is quite strong and provides a reliable signal at the bit line. After exposure of the FRAM storage unit to 85° C., a reference voltage VREF of 0.1-0.12 V is sufficient to cause a significant increase of the Bit Error Rate. In other words, the signal from the FRAM cells has become weaker due to thermal depolarization and a lower reference voltage VREF is sufficient to cause a significant increase of Bit Error Rates. This trend continues if the FRAM storage unit is exposed to higher temperatures as it is visible for the 125 C and 260 C curve for which reference voltages VREF in the range of 0.08-0.1 V and 0.05-0.065 V are sufficient and cause a significant increase in the Bit Error Rate. Finally, in an empirical analysis, it was found out that during a reflow solder process the bit information of the FRAM storage unit is becoming significantly weaker and reference voltages VREF of about 0.03-0.045 V are enough to cause a significant increase of the Bit Error Rate.

FIG. 2 refers to a read-out process in the margin mode, which means that a sense voltage, i.e. the reference voltage VREF is applied to the FRAM bit cells thus reducing the actual bit cell signal by a given amount. If the FRAM storage unit was exposed to heat and thermal depolarization happened, the actual bit cell signal of the read-out reference cells may no longer be large enough to exceed the reference voltage VREF and therefore the read-out fails. This is illustrated in the increasing Bit Error Rates. Preferably, the reference voltage VREF is generated on-chip and applied to the embedded memory during the read-out operation.

However, if the read-out of the FRAM storage unit in the margin mode fails, it may be assumed that other FRAM cells apart from the FRAM cells carrying the test data pattern have been degraded too. Advantageously, they are not degraded totally and a read-out process without a sense voltage, i.e. a read-out in a recovery mode will still work. To recover as much as possible bit cell information from the FRAM cells, the bit cell timing of the read signals (e.g. the word line, plate line and bit line/sense amplifier) is slowed down in the recovery mode. This slowdown means that the signal's speed is below the normal speed for usual operation of the FRAM storage unit. This allows a proper settling of the signals and improves the signal-to-noise ratio. Further, an increased voltage level may be provided to the plate line in order to improve the read signals and to pump more charge from the ferroelectric capacitor onto the bit lines. Since the FRAM memory data read-out is destructive, the data has to be written back to the FRAM storage unit which is preferably done under the aforementioned conditions in order to restore the full bit signal to the memory cell.

Figure 3:
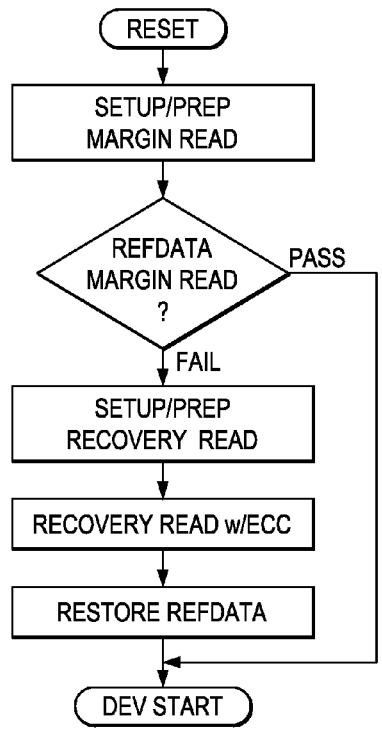
FIG. 3 is a flow chart illustrating a method for identifying and correcting a bit error in an FRAM storage unit according to an embodiment of the invention.

FIG. 3 is a flow chart for a method according to an embodiment of the invention. After a reset (RESET), the semiconductor device comprising the FRAM storage unit is set up to be ready for a read-out process using the margin mode (SETUP/PREP MARGIN READ). In other words, a sense voltage/reference voltage is applied to the respective FRAM cells comprising the test data pattern. In a further step (REFDATA MARGIN READ) the test data pattern is read-out in the margin mode. If this test is passed (branch: PASS) it may be assumed that all data that is stored in the FRAM cells is quite in good condition and the device may proceed with its boot order startup sequence (DEV START). If the read-out of the reference pattern fails, a recovery read, i.e. a complete read-out of the FRAM storage unit in a recovery mode is prepared (SETUP/PREP RECOVERY READ). In the setup of the recovery read, a second set of operating parameters is initialized, preferably the timing of the read-out signals is slowed down and the plate line is supplied with an increased voltage level. The reference voltage or sense voltage VREF is set to zero. In a subsequent step (RECOVERY READ w/ECC) the read-out process is performed in the recovery mode. According to an aspect, a bit error correction is be performed (indicated by w/ECC). After read-out of the complete FRAM storage unit and the optional bit error correction, data is written back to the FRAM storage unit preferably using the aforementioned second set of parameters in (RESTORE REFDATA). After the refreshed data is written back to the FRAM storage unit, the semiconductor device may proceed with its startup sequence (DEV START).

Figure 4:
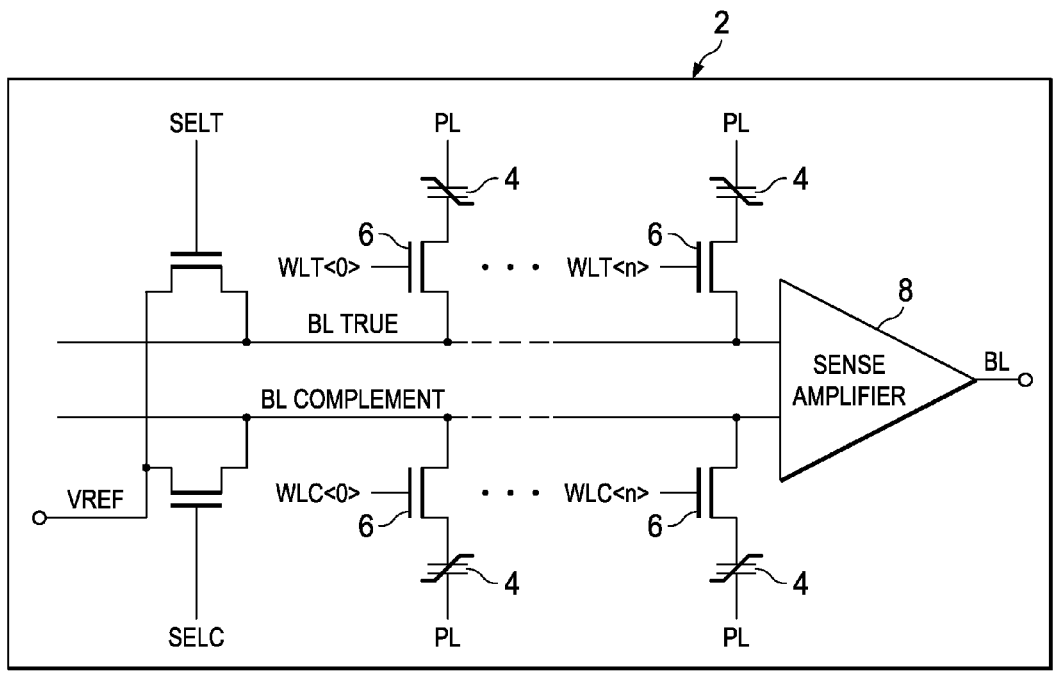
FIG. 4 is a simplified circuit diagram showing a detailed view to an FRAM unit according to an embodiment of the invention.

FIG. 4 is a simplified circuit diagram for a semiconductor device 2 comprising a control unit (not shown) and an FRAM storage unit having a plurality of FRAM cells 4. The FRAM storage units are coupled to a plate line PL with the one side and to a bit line BL at the opposite side. The connection to the bit line BL is controlled by a respective word line WL that is coupled to the gate of a transistor 6. The cell is accessed by rising the word line WL and hence turning on the access transistor 6. FIG. 4 exemplarily illustrates a ferro-electric memory cell, in the 1T-1C (one transistor, one capacitor) configuration. The FRAM storage unit comprises a plurality of n+1 FRAM storage cells as it is indicated by the respective indices. Each cell comprises two single ferro-electric capacitors 4 that provide signals to a bit line BLTRUE and a complementary bit line BLCOMPLEMENT. A sense amplifier 8 is applied to provide a bit signal to a data bus BL. A reference voltage VREF is applied to the true and complement bit line BLTRUE, BLCOMPLEMENT via selective switches CELLT and CELLC.

Although the invention has been described hereinabove with reference to a specific embodiment, it is not limited to this embodiment and no doubt further alternatives will occur to the skilled person that lie within the scope of the invention as claimed.

The invention claimed is:

1. A semiconductor device comprising a control unit and an FRAM storage unit having FRAM cells comprising a predetermined test data pattern, wherein the control unit is configured to:
   read the FRAM cells in a margin-mode that are dedicated to the test data of the test data pattern,
   compare the read out bit information with the predetermined test data pattern to determine whether a bit error is present in the dedicated FRAM cells and when a bit error is present in the dedicated FRAM cells:
   read-out the complete FRAM storage unit in a recovery-mode and
   refresh all FRAM cells of the FRAM storage unit by writing back the read out bit information to the respective FRAM cells, wherein in the margin-mode, the read operation is performed using a lower read-sensitivity compared to the read operation reading out the complete FRAM storage unit that is performed in the recovery-mode.

2. The semiconductor device of claim 1, wherein in the margin-mode, a sense voltage is applied to the FRAM cells comprising the test data pattern so as to lower a bit cell signal of the respective FRAM cells.

3. The semiconductor device of claim 2, wherein the FRAM cells of the FRAM storage unit comprise a sense amplifier for providing a bit line signal and the sense voltage is applied to the sense amplifier so as to lower a level of the bit cell output signal provided to the bit line.

4. The semiconductor device of claim 1, wherein a predetermined set of parameters is used for a standard read-out operation of the FRAM-cells, and wherein for the read operation of the complete FRAM storage in the recovery-mode a further set of parameters is applied so as to provide a read process providing a bit-cell signal having a higher signal margin in comparison to the bit-cell signal in a read operation using the set of parameters for the standard read-out.

5. The semiconductor device of claim 4, wherein the further set of parameters causes a timing of the bit-cell signals to slow down and/or a plate line to provide a higher voltage to the FRAM cells, in comparison to the standard read-out operation.

6. The semiconductor device according to claim 5, wherein the control unit is further configured to perform the write back operation using the further set of parameters.

7. The semiconductor device of claim 1, wherein the control unit is further configured to perform a bit-error correction before writing back the read out bit information.

8. A method for identifying and correcting a bit error in an FRAM storage unit of a semiconductor device, the FRAM storage unit having a plurality of FRAM cells comprising a predetermined test data pattern, the method comprising the steps of:

reading the FRAM cells that are dedicated to the test data pattern in a margin-mode,
comparing the read-out bit information with the predetermined test data pattern to determine whether a bit error is present in the dedicated FRAM cells and if so:
reading-out the complete FRAM storage unit in a recovery-mode and
refreshing all FRAM cells of the FRAM storage unit by writing back the read out bit information, wherein in the margin mode, the read operation is performed using a lower read-sensitivity compared to the read operation of the complete FRAM storage unit that is performed in the recovery-mode.

* * * * *